US012191861B2

(12) United States Patent
Pal et al.

(10) Patent No.: US 12,191,861 B2
(45) Date of Patent: Jan. 7, 2025

(54) DELAY CORRECTION FOR ON-TIME GENERATOR CIRCUITRY

(71) Applicant: TEXAS INSTRUMENTS INCORPORATED, Dallas, TX (US)

(72) Inventors: Nilanjan Pal, Dallas, TX (US); Saurav Bandyopadhyay, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/169,138

(22) Filed: Feb. 14, 2023

(65) Prior Publication Data

US 2024/0275368 A1    Aug. 15, 2024

(51) Int. Cl.
*H03K 5/01* (2006.01)
*H03K 5/24* (2006.01)
*H03K 17/56* (2006.01)
*H03K 5/00* (2006.01)

(52) U.S. Cl.
CPC ............... *H03K 5/01* (2013.01); *H03K 5/24* (2013.01); *H03K 17/56* (2013.01); *H03K 2005/00019* (2013.01)

(58) Field of Classification Search
CPC ............. H03K 5/01; H03K 5/24; H03K 17/56
See application file for complete search history.

(56) References Cited

U.S. PATENT DOCUMENTS

2020/0366241 A1* 11/2020 Tsuji ................. H03B 5/04
2022/0302199 A1* 9/2022 Kobayashi ........ H01L 27/14643

OTHER PUBLICATIONS

Texas Instruments, TPS54JA20 2.7-V to 16-V Input, 12-A Synchronous Buck Converter With Remote Sense, 3-V Internal LDO and Latch-off Current Limit; TPS54JA20; SNVSB02C, Mar. 2020—Revised Jul. 2021; 49 pgs.

* cited by examiner

*Primary Examiner* — Quan Tra
(74) *Attorney, Agent, or Firm* — Charles F. Koch; Frank D. Cimino

(57) ABSTRACT

A circuit includes a comparator having first and second comparator inputs and a comparator output. A discharge switch is coupled between the first comparator input and a ground terminal. A capacitor has first and second capacitor terminals, in which the first capacitor terminal is coupled to the first comparator input. A delay correction circuit includes a sample-hold circuit coupled to the first capacitor terminal and the second capacitor terminal. An amplifier has a first amplifier input coupled to a hold output of the sample-hold circuit and a second amplifier input coupled to the second comparator input. A variable resistor is coupled between the second capacitor terminal and the ground terminal, and has a control input coupled to the amplifier output.

21 Claims, 8 Drawing Sheets

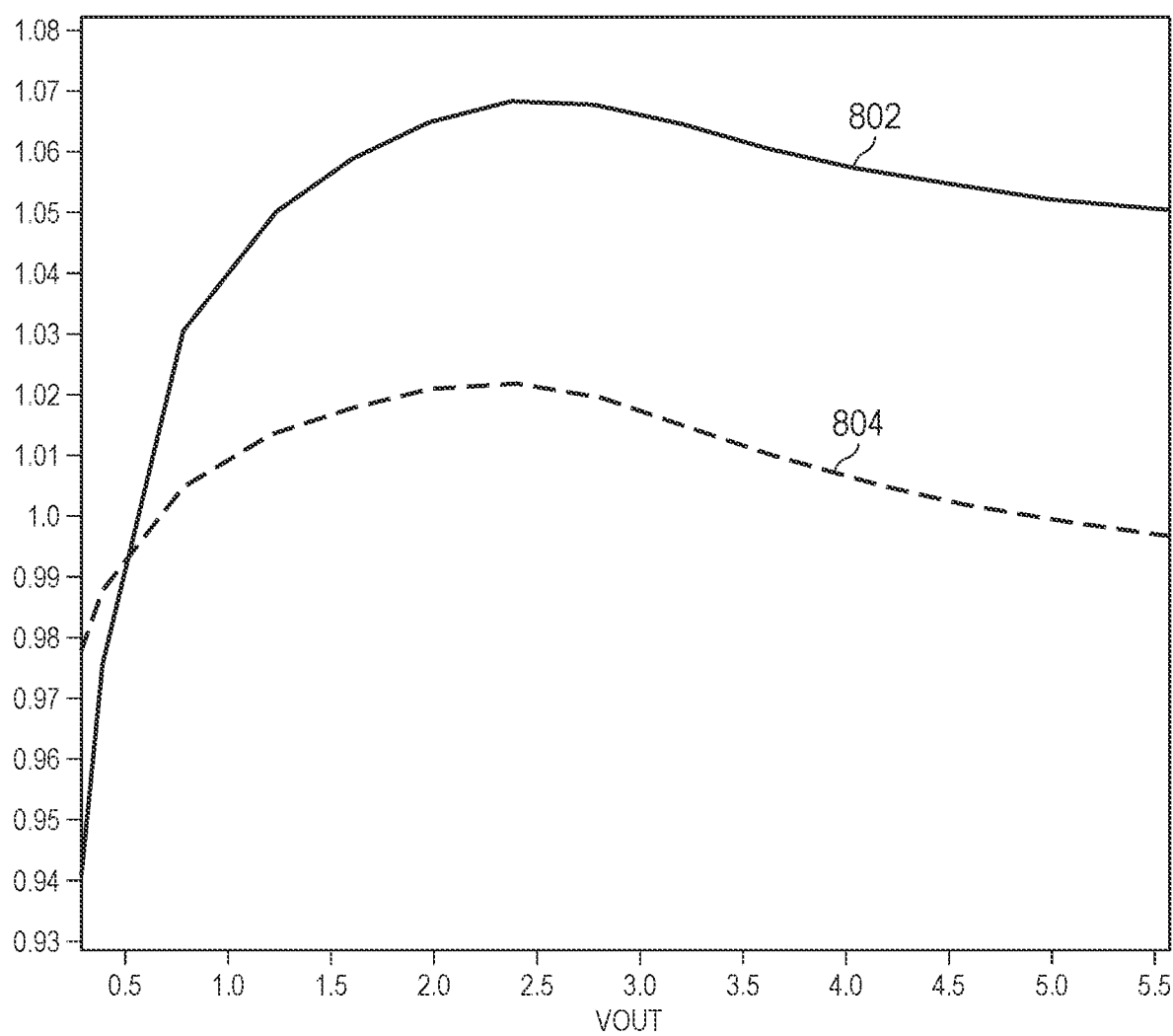

DELAY CORRECTION FOR ON-TIME GENERATOR CIRCUITRY

TECHNICAL FIELD

This description relates to delay correction for on-time generator circuitry.

BACKGROUND

Existing switch mode power converter designs can include control architectures that implement ramp generators to control timing of pulses that activate power switches (e.g., transistors) of an output stage. For example, the control architecture can be configured to control charging of a capacitor to generate a ramp signal having an on-time that is used to provide a constant switching frequency for setting a desired on-time of the power switches. The on-time of the ramp signal can be adapted (e.g., modulated) responsive to an input voltage or it can be a constant on-time. Existing architectures can add delay to the on-time that can result in error in the switching frequency of the converter.

SUMMARY

An example circuit includes a comparator having first and second comparator inputs and a comparator output. A discharge switch is coupled between the first comparator input and a ground terminal. A capacitor has first and second capacitor terminals, in which the first capacitor terminal is coupled to the first comparator input. A delay correction circuit includes a sample-hold circuit having first and second sample inputs and a hold output, in which the first sample input is coupled to the first capacitor terminal and the second sample input is coupled to the second capacitor terminal. The delay correction circuit also includes an amplifier having first and second amplifier inputs and an amplifier output, in which the first amplifier input is coupled to the hold output and the second amplifier input is coupled to the second comparator input. The delay correction circuit also includes a variable resistor having a control input and coupled between the second capacitor terminal and the ground terminal, the control input coupled to the amplifier output.

Another example circuit includes a capacitor configured to provide a capacitor voltage responsive to an input current. A comparator is configured to provide a comparator output signal responsive to the capacitor voltage and a reference voltage. A discharge switch is configured to discharge the capacitor voltage responsive to the comparator output signal. A sample-hold circuit is configured to sample a voltage across the capacitor responsive to the comparator output signal and provide a voltage signal representative of the sampled voltage. An amplifier is configured to provide an amplifier output signal responsive to the voltage signal and the reference voltage. A variable resistor is configured to provide a resistance between the capacitor and a ground terminal responsive to the amplifier output signal to adjust the capacitor voltage to compensate for a turn-on delay of the comparator output signal.

As another example, an integrated circuit includes control loop circuitry having a loop output and an on-time generator circuit having a trigger input coupled to the loop output. The on-time generator circuit can include a voltage-to-current converter having a converter input and a converter output, in which the converter input is coupled to an input voltage terminal. The on-time generator circuit can also include a comparator having first and second comparator inputs and a comparator output, in which the first comparator input is coupled to the converter output and the second comparator input is configured to receive a reference voltage. The on-time generator circuit can also include a discharge switch coupled between the first comparator input and a ground terminal and a capacitor having first and second capacitor terminals, in which the first capacitor terminal coupled to the first comparator input. The on-time generator circuit can also include a delay correction circuit that includes a sample-hold circuit, an amplifier and a variable resistor. The circuit can also include modulation logic and a drive circuit. The modulation logic has first and second modulation inputs and a modulation output, in which the first modulation input is coupled to the comparator output and the second modulation input is coupled to the loop output. A drive circuit has a drive input and first and second drive outputs, in which the drive input is coupled to the modulation output.

BRIEF DESCRIPTION OF THE DRAWINGS

FIG. 8 diagram showing a comparison of switching frequency variation for two different power converter circuits.

DETAILED DESCRIPTION

This description relates to delay correction for on-time generator circuitry, such as can be implemented in power converters.

As an example, a circuit includes a voltage-to-current converter configured to provide a current responsive to an input voltage, and the current is used to charge a capacitor and provide a capacitor voltage. The capacitor can be discharged by a discharge switch to rapidly decrease the capacitor voltage responsive to a comparator signal. Thus, the capacitor voltage provides a ramp signal responsive to charging and discharging the capacitor. The circuit includes a comparator configured to provide the comparator output signal to control the discharge switch responsive to the capacitor voltage and a reference voltage (e.g., proportional to an output voltage). The comparator can introduce a propagation delay that adds time to the on-time, which can result in significant error in the operating frequency of associated circuitry that uses the on-time provided by the comparator output signal.

To compensate for the delay introduced by the comparator, the on-time generator circuit includes a delay correction circuit. The delay correction circuit can be implemented as a feedback loop within the on-time generator configured to adjust the capacitor voltage to cause the ramp signal to cross the reference voltage at a time that is aligned with when the comparator trips (e.g., a state change in the comparator output signal). For example, the delay correction circuit includes a sample-hold circuit configured to sample a voltage across the capacitor responsive to the comparator output signal and provide a voltage signal representative of the sampled capacitor voltage. By sampling when the comparator triggers, the voltage across the capacitor is representative of a voltage adapted to trigger the comparator based on the reference voltage. An amplifier is configured to provide an amplifier output signal responsive to the sampled voltage signal and the reference voltage. The delay correction circuit also includes a variable resistor (e.g., a transistor) configured to provide a resistance between the capacitor and a ground terminal that is responsive to the amplifier output signal. The voltage across the variable resistor is thus configured to adjust (e.g., introduce a voltage shift in) the capacitor voltage to compensate for the turn-on delay, which the comparator introduces into the comparator output signal.

As a result, associated circuitry (e.g., power converter or other circuits) using the comparator output as an on-time generator can exhibit improved operation over a range of voltages and frequencies. Also, because the delay correction circuit can neutralize the delay of the comparator, less complicated circuitry (e.g., smaller and less expensive) can be used to implement the comparator. Additionally, because the delay correction circuit is self-adjusting during operation, additional trimming of the circuitry is not required.

Figure 1:
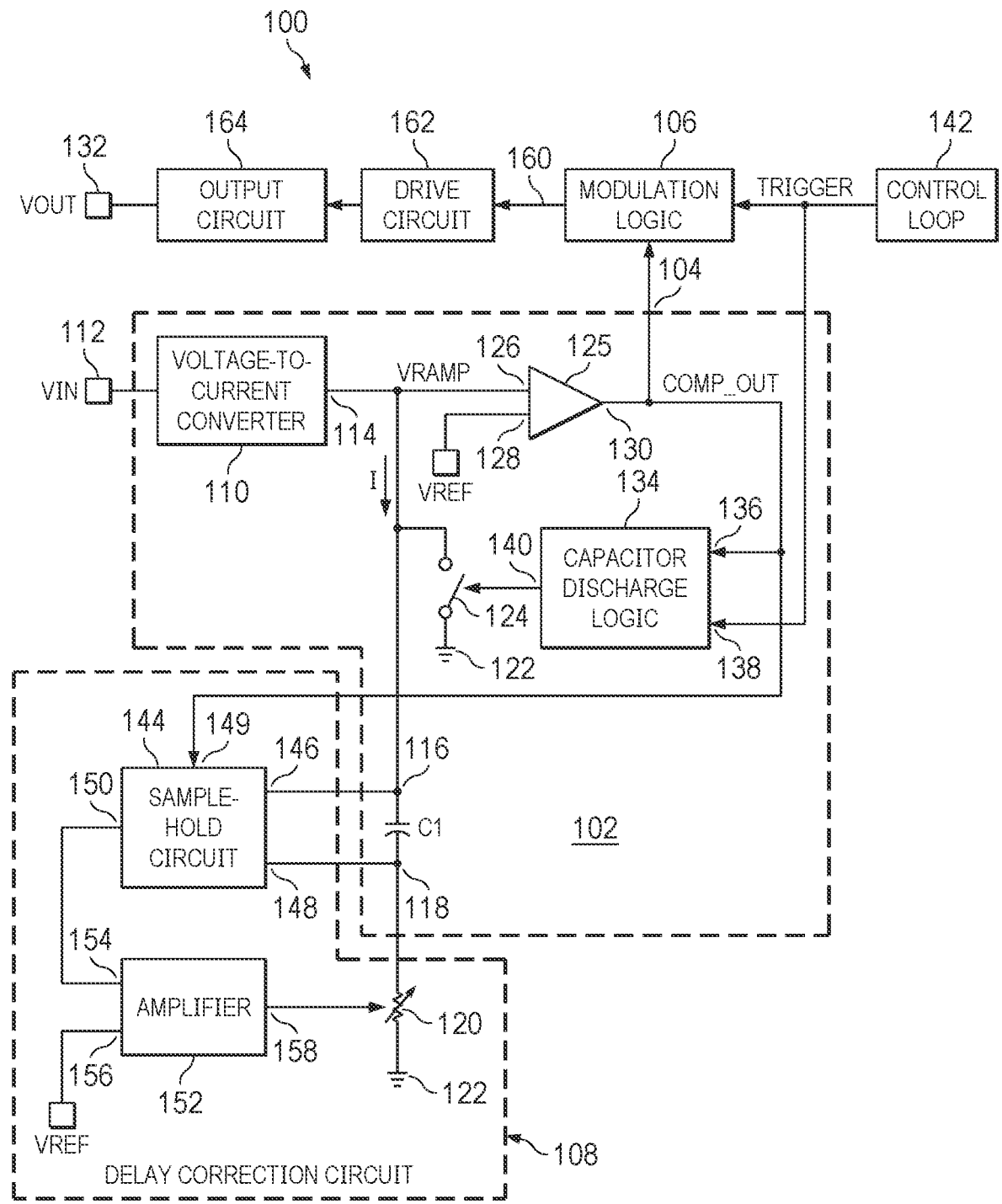
FIG. 1 is a block diagram of an example circuit.

FIG. 1 is a block diagram of a circuit 100 that includes on-time generator circuitry (also referred to as an on-time generator) 102. For example, the on-time generator 102 has an output 104 coupled to an input of modulation logic 106. The on-time generator 102 is configured to provide an output signal, which the modulation logic 106 uses to control the on-time of a modulated output signal provided by the modulation logic. As described herein, the circuit 100 also includes a delay correction circuit 108 configured (e.g., as a feedback loop) to compensate for (e.g., neutralize) a time delay introduced by the on-time generator in producing the output signal at 104. The delay correction circuit 108 can be considered as part of the on-time generator 102.

In the example of FIG. 1, the on-time generator 102 includes a voltage-to-current converter 110 having a converter input coupled to an input voltage terminal 112. The voltage-to-current converter 110 also has a converter output 114 and is configured to provide a current (I) proportional to an input voltage VIN received at 112. Thus, the current can vary responsive to changes in the input voltage VIN. A capacitor C1 has first and second capacitor terminals 116 and 118, in which the first capacitor terminal 116 is coupled to converter output 114. A variable resistor 120 of the delay correction circuit 108 is coupled between the second capacitor terminal 118 and a ground terminal 122. A discharge switch 124 is coupled between the converter output 114 and the ground terminal 122 in parallel with the circuit path provided by the capacitor C1 and resistor 120. The path through the switch and the path through the capacitor C1 and the resistor 120 thus provide alternative current paths for the current I. The switch 124 can be implemented as a semiconductor or other type of switching device, such as a transistor (e.g., field effect transistor (FET), bipolar junction transistor (BJT)), a thyristor or the like.

A comparator 125 has first and second comparator inputs 126 and 128 and a comparator output 130. The first comparator input 126 is coupled to the converter output 114 (also coupled to the first capacitor terminal 116) and receives a ramp voltage signal VRAMP provided responsive to charging and discharging the capacitor C1. The second comparator input 128 is coupled to a reference voltage terminal adapted to receive a reference voltage VREF. For example, VREF is proportional to an output voltage VOUT provided by the circuit 100 at an output 132 of the circuit (e.g., VREF=αVOUT, where α is a proportionality constant). The comparator 125 is configured to provide a comparator output signal COMP_OUT at the comparator output 130 responsive to the signals VRAMP and VREF at the comparator inputs 126 and 128.

The on-time generator 102 also includes capacitor discharge logic 134 configured to control discharging of the capacitor C1. The capacitor discharge logic 134 has inputs 136 and 138 and an output 140. The input 136 is coupled to the comparator output 130 and the input 138 is coupled to an output of a control loop 142, which is configured to provide a TRIGGER signal. The comparator output 130 is also coupled to the output 104 of the on-time generator 102, which is also coupled to the input of the modulation logic 106. The capacitor discharge logic 134 is configured to provide a control signal at 140 to a control input of the switch 124 responsive to the COMP_OUT and TRIGGER signals at 136 and 138. For example, charging and discharging of the capacitor C1 provides the ramp signal VRAMP at the comparator input 126. As described herein, the comparator 125 introduces a delay The delay correction circuit 108 includes a sample-hold circuit 144 having first and second sample inputs 146 and 148, a control input 149 and a hold output 150. The first sample input 146 is coupled to the first capacitor terminal 116 and the second sample input 148 is coupled to the second capacitor terminal 118. The control input 149 is coupled to the comparator output 130. The sample-hold circuit 144 is configured to control sampling a voltage across the capacitor C1 responsive to the COMP_OUT signal and provide an output signal at 150 representative of the sampled voltage across C1.

An amplifier 152 has first and second amplifier inputs 154 and 156 and an amplifier output 158. The first amplifier input 154 is coupled to the hold output 150 and the second amplifier input 156 is coupled to the reference voltage terminal to receive the reference voltage VREF (e.g., also coupled the second comparator input 128). The amplifier 152 is configured to provide an amplifier output signal at the amplifier output 158 responsive to the sampled voltage signal at 150 and the reference voltage VREF. The variable resistor 120 is configured to provide a resistance (between the second capacitor terminal and ground) responsive to the amplifier output signal at 158. The variable resistor 120 is configured to adjust the voltage at the first capacitor terminal 116 to enable the comparator 125 to provide COMP_OUT to trip (e.g., change states) more precisely at a time when the voltage across C1 (e.g., between terminals 116 and 118) crosses VREF. The delay correction circuit 108 thus can provide a feedback loop for the on-time generator 102 to compensate for the propagation time delay of the comparator 125. Advantageously, as a result of using the delay correction circuit, less complicated comparator designs having a smaller area can be used in the circuit 100 to achieve comparable or better performance than existing approaches. The area overhead by adding the delay correction circuit is small compared to the area saved by using a smaller, less complicated instance of the comparator 125.

The modulation logic 106 is configured to provide a modulated output signal at an output 160 responsive to the COMP_OUT and TRIGGER signals. Because the on-time in the COMP_OUT signal is adjusted to remove the time delay of the comparator 125, the modulated signal at 160 likewise can be free of the effects of the comparator time delay. A drive circuit 162 has an input coupled to the output 160 configured to provide one or more drive signals to respective input(s) of an output circuit 164 responsive to the modulated signal. In an example, the modulation logic is pulse-width-modulation (PWM) logic configured to provide a PWM output to the drive circuit 162. The drive circuit 162 is configured to provide drive signals to respective power transistors of the output circuit 164, which provides the output voltage VOUT at 132. As a result of implementing the delay correction circuit 108, the output voltage VOUT exhibits significantly less switching frequency variation over a range of output voltages compared to circuits using existing on-time generator circuitry. The circuit 100 (or at least a portion thereof) can be implemented as an integrated circuit (IC). In one example, the IC includes the components of the on-time generator 102 and the delay correction circuit 108. Additionally, or as an alternative, the IC can include the control loop 142, the modulation logic 106, and the drive circuit 162. As yet another alternative, the IC can include the output circuit 164, such as power transistors.

Figure 2:
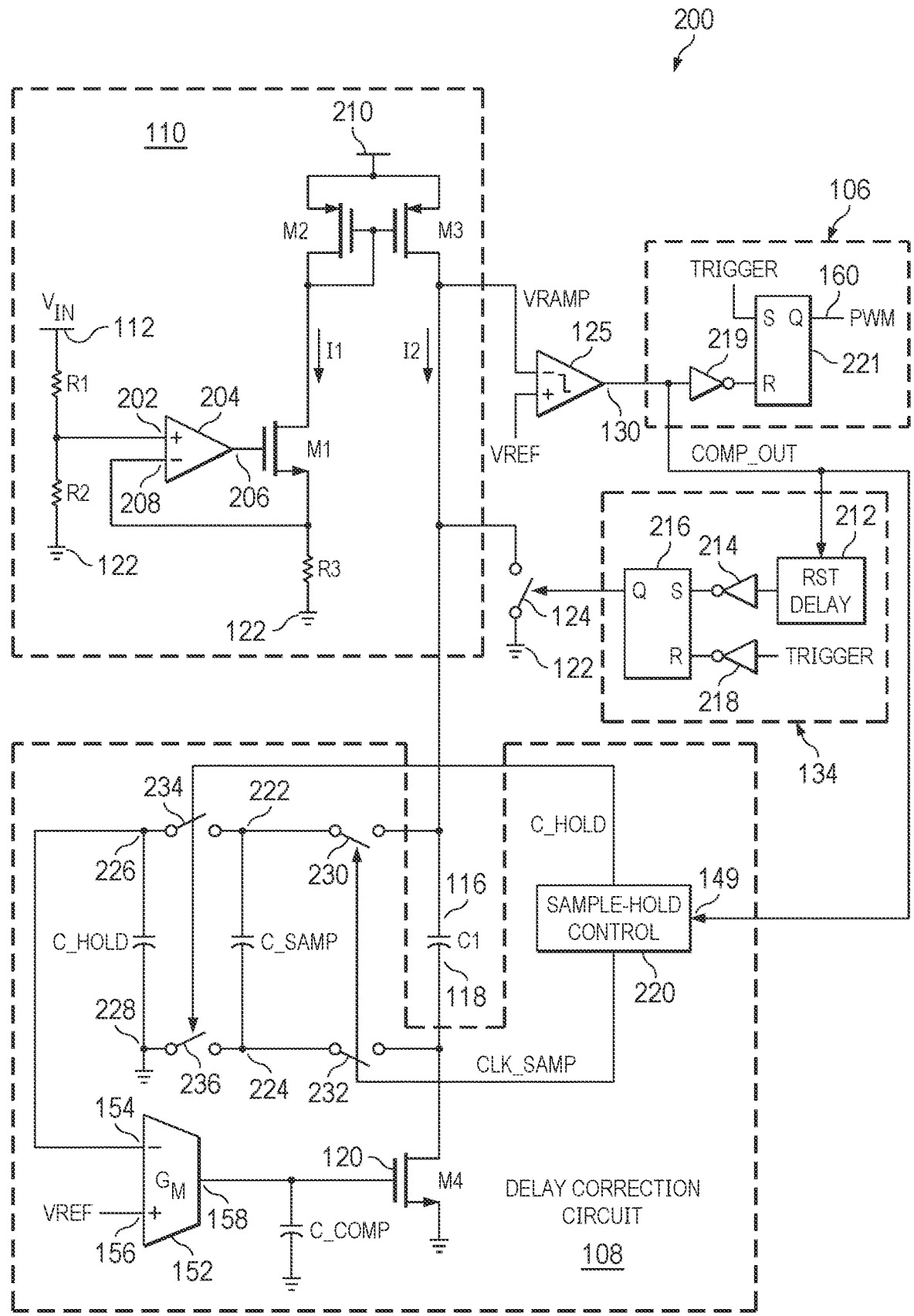
FIG. 2 is a circuit diagram of an example on-time generator circuit.

FIG. 2 is a circuit diagram showing an example on-time generator circuit 200. The circuit 200 provides a useful example of circuitry 102, 106 and 108 shown in FIG. 1. Accordingly, the description of FIG. 2 also refers to FIG. 1. The circuit 200 includes a voltage-to-current converter 110 configured to provide current I2, which is proportional to input voltage VIN, for charging a capacitor C1. In the example of FIG. 2, the voltage-to-current converter 110 includes a divider circuit that includes resistors R1 and R2 coupled in series between an input voltage terminal 112 and a ground terminal 122. The divider circuit is configured to provide a voltage at a non-inverting input 202 of an operational amplifier 204 proportional to VIN, such as β*VIN, where $$\beta = \frac{R1}{R1 + R2}.$$

The op-amp 204 has an output 206 coupled to a gate of a transistor M1, which is coupled between the drain of a diode-connected transistor M2 and a resistor R3. An inverting input 208 of op-amp 204 is coupled to the source of M1 (e.g., at a node interconnecting R3 and M1).

The op-amp 204 is configured to control M1 to provide current I1 through a path that includes R3 responsive to the voltages at inputs 202 and 208. The current I1 is proportional to VIN $$\left(e.g., I1 = \frac{\beta * VIN}{R3}\right).$$

The gate and source of M2 are coupled to the gate and source, respectively, of transistor M3 to provide a current mirror, in which the sources of M2 and M3 are coupled to a voltage terminal 210. The current mirror is configured to provide current I2 at the drain of M3, which is coupled to a first terminal of capacitor C1. The current I2 can be proportional or equal to the current I1 depending on a current mirror ratio between M2 and M3. As described herein, the terminal 116 of C1 is coupled to the inverting input of comparator 125 and thus configured to provide a ramp voltage responsive to charging and discharging of C1.

The comparator 125 is configured to provide a comparator output signal COMP_OUT at the comparator output 130 responsive to VRAMP and a reference voltage VREF. Capacitor discharge logic 134 has inputs configured to receive the COMP_OUT and TRIGGER signals. The capacitor discharge logic 134 includes a delay circuit (RST DELAY) 212 having an input coupled to the comparator output 130. The delay circuit 212 is configured to impose a time delay on COMP_OUT and provide the delayed COMP_OUT to an input of an inverter 214, which is coupled to a set input of an SR flip-flop 216. An input of another inverter 218 receives the TRIGGER signal and is configured to provide an inverted trigger to a reset input of the flip-flop 216. A Q output of the flip-flop 216 is coupled to a control input of switch 124, which is coupled between capacitor terminal 116 and ground terminal 122. The capacitor discharge logic 134 is thus configured to control the switch 124 to discharge capacitor C1 responsive to the COMP_OUT and TRIGGER signals.

In the example of FIG. 2, the modulation circuit 106 is a PWM modulator. The PWM modulator includes an inverter 219 having an input coupled to the comparator output 130. The PWM modulator also includes an SR flip-flop 221 having a reset input coupled to an output of the inverter 219 and a reset input configured to receive a TRIGGER signal (e.g., from control loop circuitry 142). The flip flop 221 is configured to provide a PWM output signal at the output 160 (e.g., the Q output of the flip flop) responsive to the TRIGGER signal and an inverted version of the COMP_OUT signal.

The sample-hold circuit 144 configured to sample the voltage across C1 (e.g., between capacitor terminals 116 and 118) responsive to COMP_OUT and provide a voltage signal at the hold output representative of the sampled voltage. In FIG. 2, the sample-hold circuit 144 includes a sample-hold control circuit 220 configured to control the sampling and holding functions of the sample-hold circuit responsive to the COMP_OUT signal. For example, the sample-hold control circuit 220 is configured to provide a clock signal, shown as CLK_SAMP, to activate the sampling function and another clock signal, shown as CLK_HOLD, to activate the holding function. The sample-hold control circuit 220 provides the CLK_SAMP and CLK_HOLD signals so the sampling and holding functions of the sample-hold circuit 144 do not overlap.

In the example of FIG. 2, the sample-hold circuit 144 includes a sample capacitor C_SAMP having third and fourth capacitor terminals 222 and 224, and a hold capacitor C_HOLD having fifth and sixth capacitor terminals 226 and 228. A switch 230 is coupled between capacitor terminals 116 and 222, and another switch 232 is coupled between capacitor terminals 118 and 224. The switches 230 and 232 are thus configured to couple C_SAMP across C1 to sample the capacitor voltage responsive to the CLK_SAMP signal. A switch 234 is coupled between capacitor terminals 226 and 222, and another switch 236 is coupled between capacitor terminals switches 224 and 228. The switches 234 and 236 are configured to couple C_HOLD across C_SAMP to transfer the sampled voltage to C_HOLD responsive to the CLK_HOLD signal. The switches 230, 232, 234 and 236 can be implemented as a semiconductor or other type of switching device, such as a transistor (e.g., FET or BJT), a thyristor or the like.

The amplifier 152 has an inverting input 154 coupled to the capacitor terminal 226 and configured to receive the sampled voltage across C_HOLD. The inverting input 156 of the amplifier 152 is configured to receive VREF. As described herein VREF can be proportional to an output voltage VOUT, such as responsive a proportionality constant depending on a ratio of components in a divider circuit used to provide VREF. The amplifier is configured to provide an amplifier output signal at the amplifier output 158 responsive to the sampled voltage at 226 and VREF. In the example of FIG. 2, a compensation capacitor C_COMP is coupled between the amplifier output 158 and ground.

Also, in FIG. 2, the variable resistor is implemented as a field transistor M4. M4 is shown as a FET. In other examples, M4 could be implemented using another transistor technology (e.g., BJT) or another type of variable resistor. The amplifier is configured to provide the amplifier output signal at 158 to control M4 in its linear mode responsive to the voltage signal at 154 and VREF. The delay correction circuit 108 provides a feedback loop configured to cooperate with a main control loop (e.g., control loop 142) and adjust VRAMP so the comparator 125 trips when the voltage across C1 crosses VREF. As a result, the propagation time delay of the comparator 125 is effectively compensated or neutralized.

Figure 3:
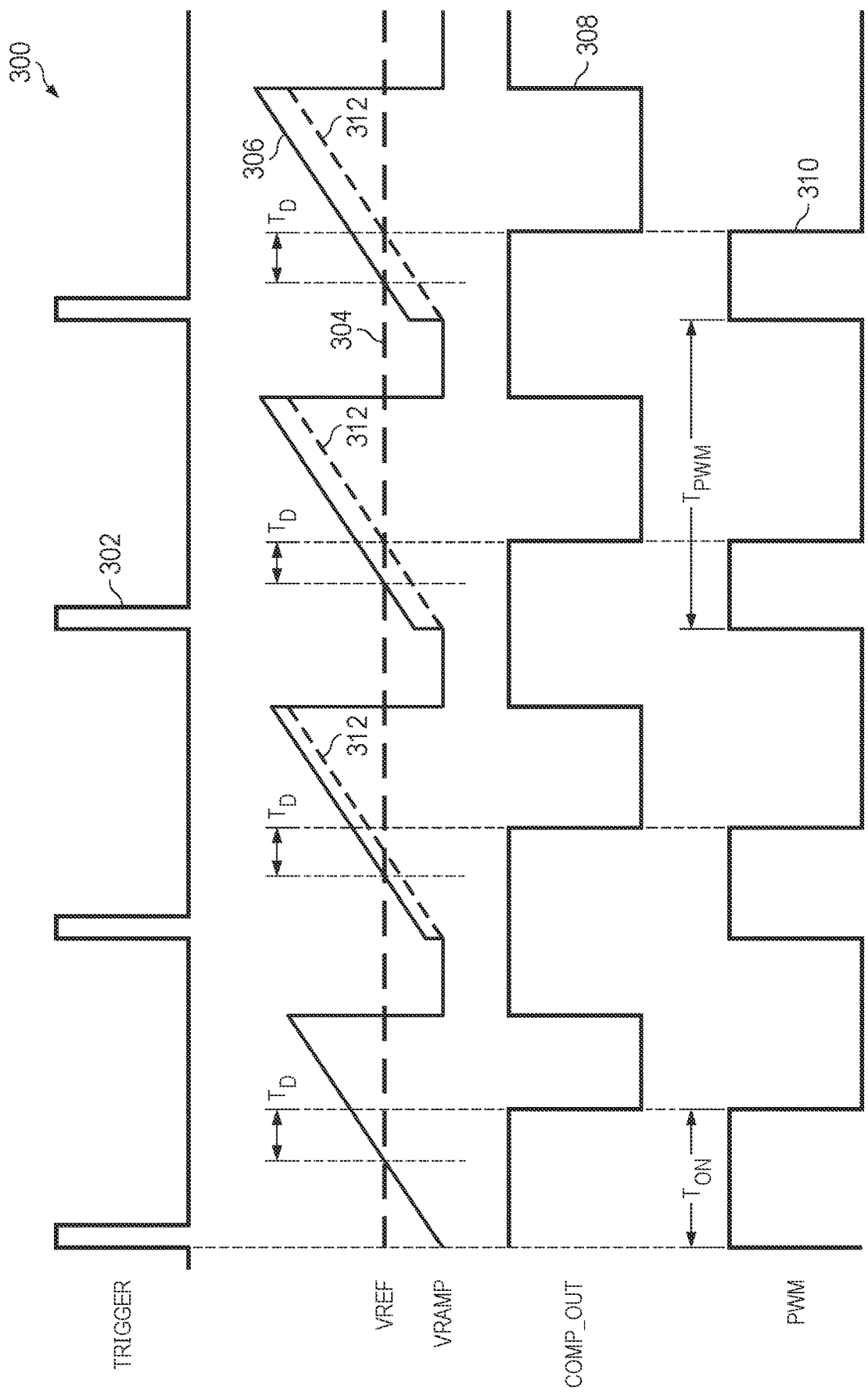
FIG. 3 is signal diagram showing examples of signal waveform in the circuit of FIG. 2.

FIG. 3 is signal diagram 300 showing examples of signals 302, 304, 306, 308 and 310 provided in the on-time generator circuit of FIG. 2. The signal 302 is representative of the TRIGGER signal, such as a periodic pulse signal provided by the control loop 142. The signal 304 is representative of VREF, which can be provided as a feedback signal representative of an output voltage. The signal 306 is representative of VRAMP provided responsive to charging and discharging of C1 as adjusted by the delay correction circuit 108 over time. The signal 308 is representative of COMP_OUT provided by the comparator 125, and the signal 310 is representative of the PWM signal generated by the modulation logic 106 responsive to COMP_OUT and TRIGGER signals 302 and 308, respectively. As shown in FIG. 3 a time delay TD is representative of a propagation time delay between VRAMP signal 306 crossing VREF 304 and the COMP_OUT going low. As described herein, the delay correction circuit 108 is configured to adjust the resistance of the variable resistor 120 (over a number of cycles) to provide corresponding adjustments in VRAMP 306 to align the crossing VRAMP with when the comparator is activated (e.g., to change from high to low voltage states), as shown by dotted lines 312. As a result of removing the time delay TD from COMP_OUT signal 308, the on-time TON of the PWM signal 310 is likewise adjusted and thus omits the propagation time delay.

Figure 4:
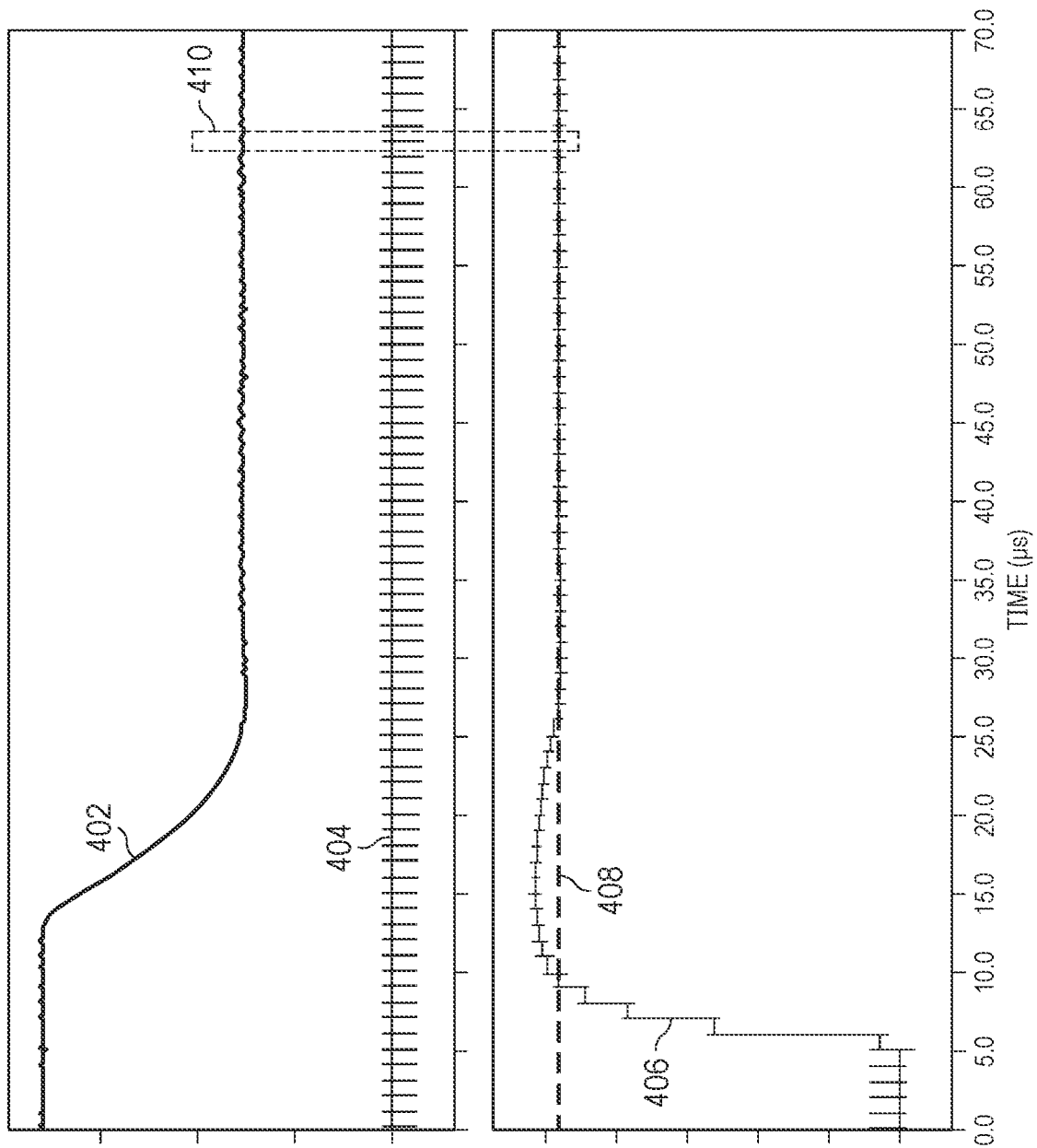
FIG. 4 is a time-domain plot 400 showing examples of signals in the circuit of FIG. 2 over a number of cycles.
Figure 5:
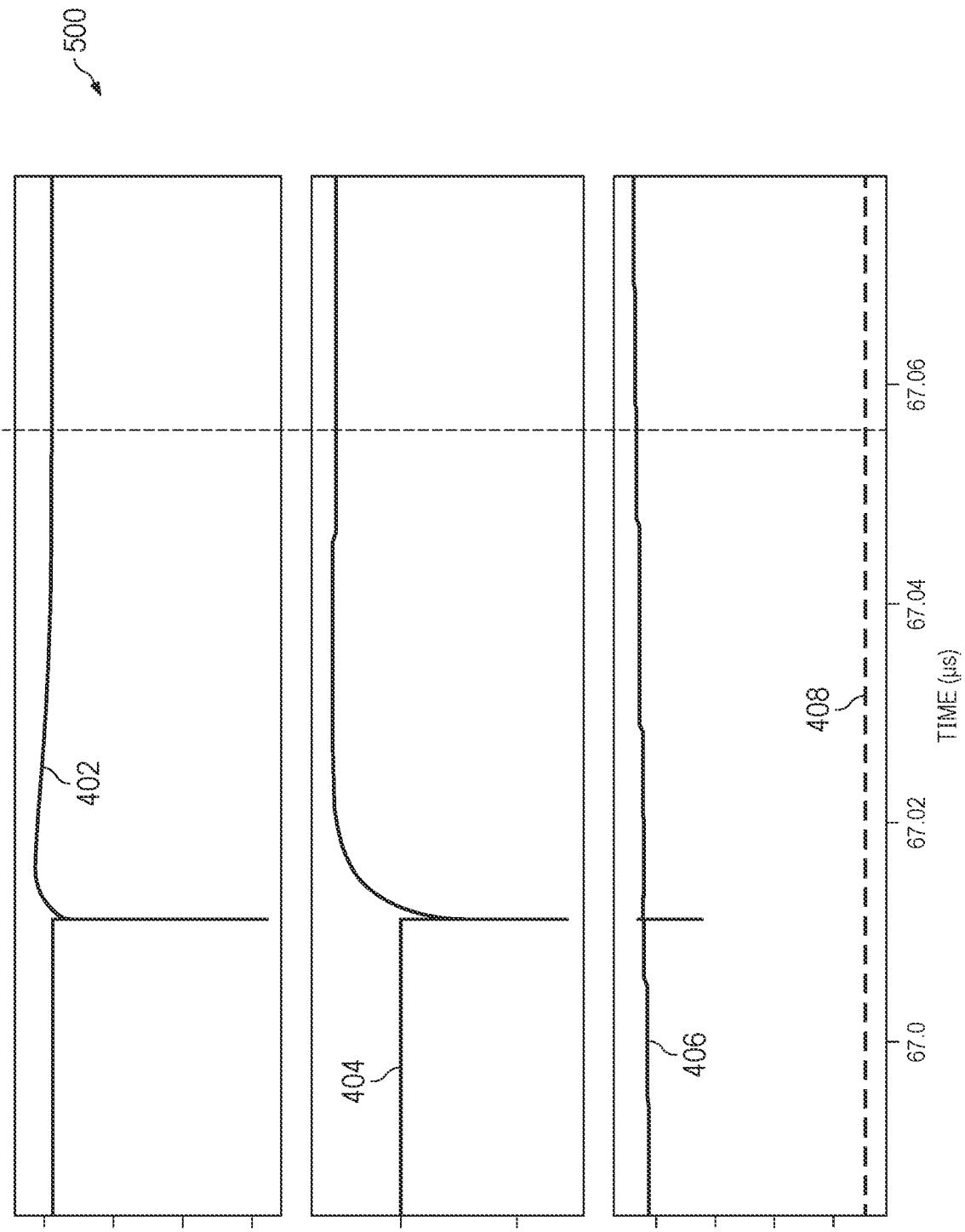
FIG. 5 is a plot of voltage over time showing zoomed-in portions of waveforms for signals in the circuit of FIG. 4.

FIG. 4 is a time-domain plot 400 showing examples of signals in the circuit of FIG. 2 over a number of cycles. The plot 400 includes signal 402 representative of the voltage at 158 applied to the gate of M4, showing an initial large value, which decreases over time to control the resistance of M4. Signal 404 is representative of the voltage at 118 (e.g., also representative of the drain voltage of M4) remains near 0 V. The plot also includes signals 406 and 408 representative of sampled voltage at 154 and VREF, respectively, showing how the delay correction circuit 108 forces the sampled voltage at 154 (representative of the voltage across C1) to VREF over a number of cycles and remain at VREF during operation. FIG. 5 is a plot 500 of voltage over time showing zoomed-in portion of waveforms, shown at 410, from FIG. 4.

Figure 6:
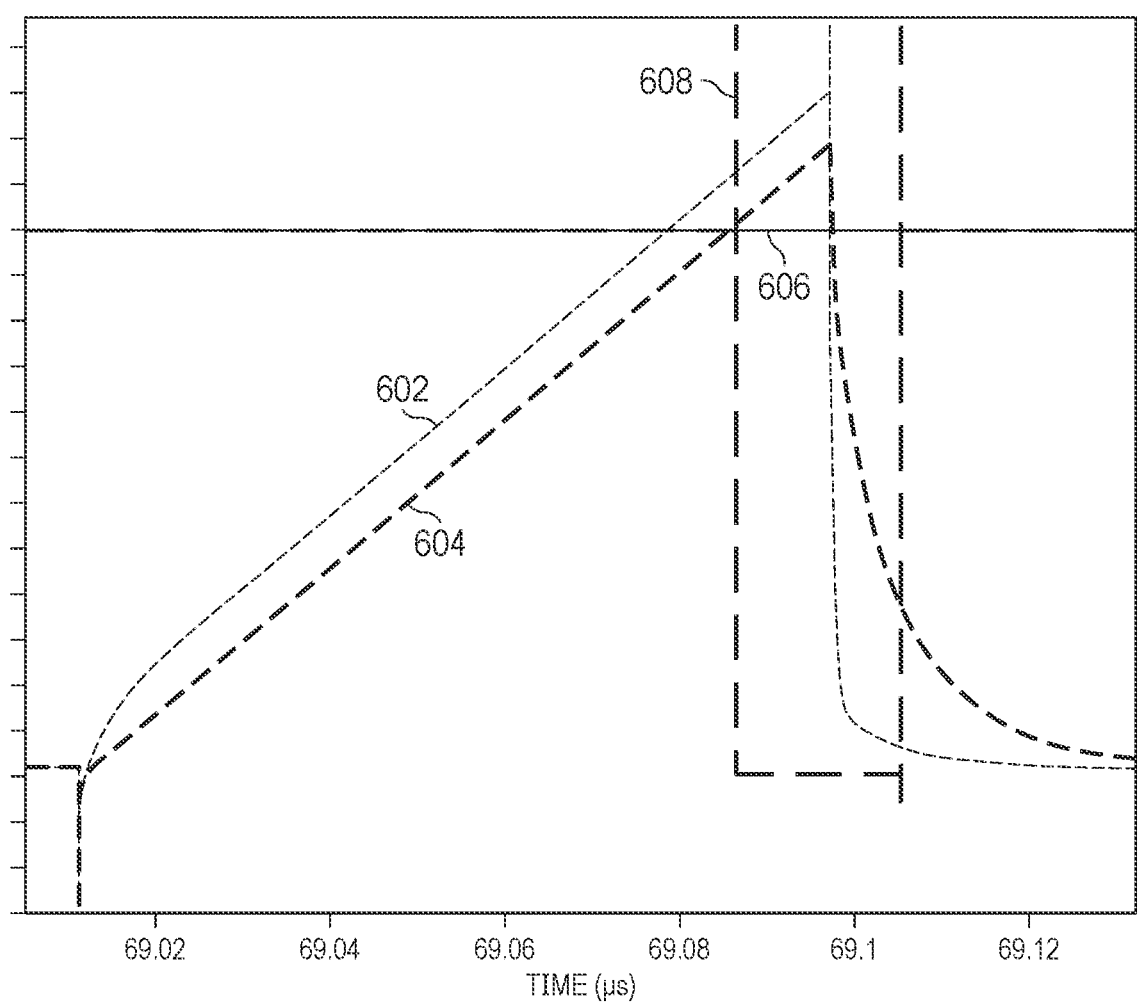
FIG. 6 is a time-domain plot of voltage over time showing examples waveforms responsive to tripping the comparator in the circuit of FIG. 2.

FIG. 6 is a time-domain plot 600 showing examples waveforms for signals for circuit of FIG. 2 responsive to tripping the comparator 125 in the circuit of FIG. 2. The plot includes a signal 602 representative of VRAMP (at input 126 of comparator 125) and a signal 604 representative of the voltage across C1. The plot also includes a signal 606 representative of VREF and a signal 608 representative of COMP_OUT. The plot 600 shows the respective signals for a time interval after the delay correction circuit 108 has operated over a number of cycles to neutralize the propagation time delay of the comparator 125. As shown in FIG. 6, the comparator trips (e.g., changes from high to low voltage states) at time when the signal 604 crosses the signal 606.

Figure 7:
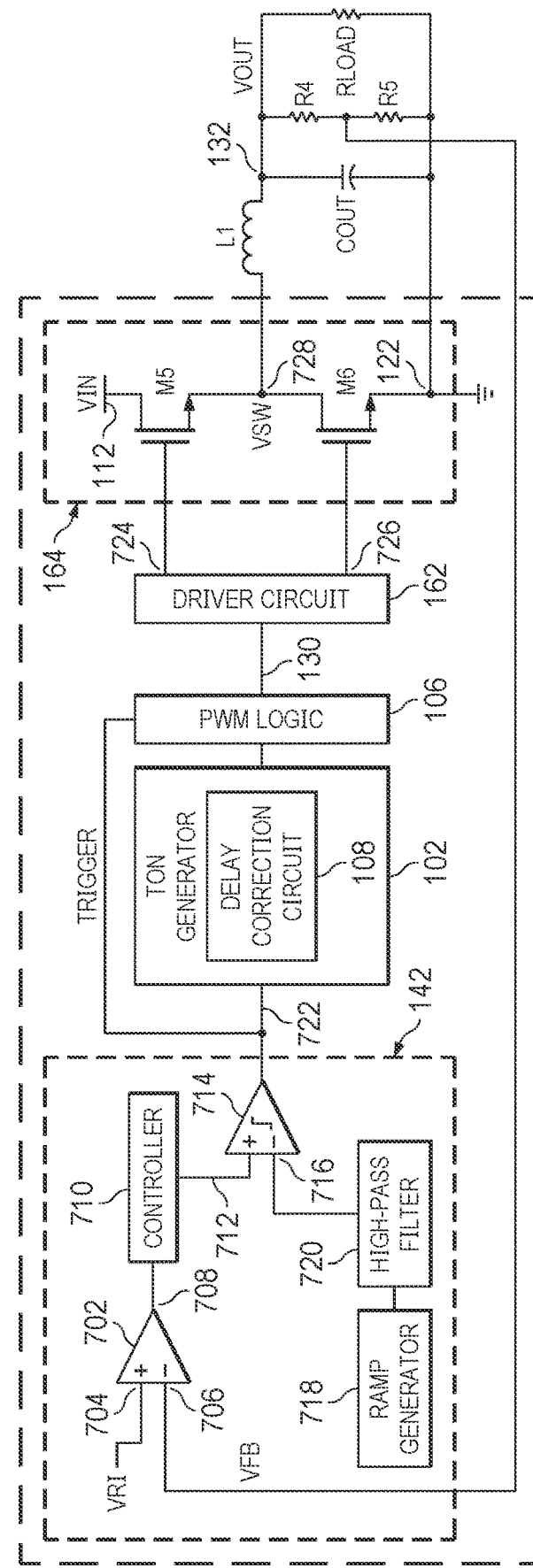
FIG. 7 is a schematic block diagram of an example power converter circuit.

FIG. 7 is a schematic block diagram of an example power converter circuit 700. For example, the circuit 700 can be implemented as a buck, boost, buck-boost or other converter topology. The power converter circuit 700 provides an example of the circuit 100 of FIG. 1. Accordingly, the description of FIG. 7 also refers to FIG. 1. The converter circuit includes a control loop 142 configured to control operation of the converter circuit. The control loop 142 includes an amplifier 702 having inputs 704 and 706 and configured to receive a reference input voltage VRI and a feedback voltage VFB. For example, VRI is set to a voltage to enable the circuit 700 to provide a desired output voltage VOUT at the power converter output 132. VFB can be a scaled (e.g., divided down) voltage representative of VOUT at 132, such as provided by a divider circuit of resistors R4 and R5 coupled between the output 132 and ground terminal 122. The amplifier 702 is configured to provide an amplified error signal at an amplifier output 708 based on a difference between VRI and VFB.

A controller 710 is configured to maintain the voltage VOUT and/or current at the output at 132, which can be under varying load and input conditions. For example, the controller 710 is configured as a proportional compensator, a proportional-integral (PI) compensator or a proportional-integral-derivative (PID) compensator, such as to tune the gain and/or phase of the converter circuit 700. The controller 710 is configured to provide a control signal at an output 712 thereof to a non-inverting input of a summing comparator 714. The comparator 714 also receives a filtered ramp signal at an inverting input 716. For example, the control loop 142 includes a ramp generator 718 configured to provide a ramp signal and a filter (e.g., a high-pass filter) 720 is configured to remove low-frequency components and provide the filter ramp signal at 716. The comparator is configured to provide a TRIGGER pulse signal at 722 responsive to the control signal at 712 and the ramp signal at 716.

An on-time generator 102 has an input coupled to the output of the comparator 714 to receive the TRIGGER signal. The on-time generator 102 also has an output 130 coupled to an input of modulation logic 106, which is implemented as PWM logic in the example of FIG. 7. The logic 106 also has another input coupled to the output of the comparator 714 to receive the TRIGGER signal. As described herein, the on-time generator 102 includes a comparator configured to provide a COMP_OUT signal at 130, which includes a propagation time delay associated with operation of timing circuitry of the on-time generator. The on-time generator thus can include a delay correction circuit 108 configured to compensate for error introduced by such time delay, such as described herein. As a result, the modulation logic 106 is configured to provide a PWM output signal to driver circuit 162 responsive to the corrected COMP_OUT signal and the TRIGGER signal. Advantageously, the on-time of the PWM signal can be provided without effect (e.g., due to compensation) of the propagation time delay variation that otherwise can occur in existing circuits.

The driver circuit 162 has outputs 724 and 726 coupled to inputs of an output circuit 164. For example, the output circuit 164 includes transistors (e.g., power FETs) M5 and M6 coupled between input voltage terminal 112 and the ground terminal 122, and outputs 724 and 726 are coupled to respective gates of M5 and M6. The source of M5 and drain of M6 are coupled to a switching output 728 of the output circuit 164. M5 and M6 are configured to provide a switching voltage signal VSW at 728 responsive to the drive signals at 724 and 726. An inductor L1 is coupled between the switching output 728 and the output 132, and an output capacitor COUT is coupled between the output 132 and the ground terminal 122. A load, shown as resistor RLOAD, can also be coupled to the output 132. The converter is configured to provide the output voltage VOUT at 132 for providing power to the load (RLOAD).

FIG. 8 is a diagram 800 showing plots 802 and 804 switching frequency as a function of output voltage (VOUT) showing frequency variation for simulation results of different power converter circuits. The frequency plot 802 shows frequency variation over a range of output voltages for a power converter implemented using an existing on-time generator circuit. The frequency plot 804 shows frequency variation over the range of output voltages for a power converter 700 implemented using the on-time generator 102 and delay correction circuit 108, as described herein. The plot 802 for the existing approach has switching frequency variation of about 13% compared to about 4% for the plot 804. Thus, using an on-time generator with delay correction, as described herein can reduce switching frequency variation over a range of output voltages. As an example, referring to FIGS. 2 and 7, switching frequency ($F_{SW}$) can be expressed as follows:

$$F_{SW} = \frac{V_{OUT}/V_{IN}}{TON} = \frac{1}{\frac{\alpha * R3 * C1}{\beta} + \frac{VIN}{VOUT}*(TD-RM4*C1)}$$

where: α is a proportionality constant for VREF (e.g., VREF=α*VOUT);
β is a proportionality constant for the voltage at 202 of FIG. 2 (e.g., voltage at 200=β*VIN); and
RM4 is the resistance of variable resistor 120.

Thus, by dynamically setting the resistance of RM4 so TD=RM4*C1, the propagation time delay TD that manifests in the on-time of the PWM signal can be neutralized.

While the examples herein focus on reducing timing errors in power converter circuits, the approach described here is equally applicable to any current-charging capacitor-based timing circuits, such as oscillators (e.g., relaxation oscillators). Additionally, the approach described herein can enable opportunities for making small-area comparators (e.g., comparator 125) with large delay variations (as well as delay variations due to any following circuits), as the delay correction circuit described here can be configured to correct for such combination of delays. Because the delay correction circuit can operate dynamically to compensate for delay errors according to operating conditions, the approach can afford immunity from process variations and temperature variations that might affect operation. Because the delay correction circuit is self-adjusting in the approach described herein, setting trim resistors and testing can be eliminated unlike many existing designs.

In this description, the term "based on" means based at least in part on.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, a device that is "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof. Furthermore, a circuit or device described herein as including certain components may instead be configured to couple to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be configured to couple to at least some of the passive elements and/or the sources to form the described structure, either at a time of manufacture or after a time of manufacture, such as by an end user and/or a third party.

Modifications are possible in the described embodiments, and other embodiments are possible, within the scope of the claims.

What is claimed is:

1. A circuit comprising:
   a comparator having first and second comparator inputs and a comparator output;
   a discharge switch coupled between the first comparator input and a ground terminal;
   a capacitor having first and second capacitor terminals, the first capacitor terminal coupled to the first comparator input; and
   a delay correction circuit comprising:
      a sample-hold circuit coupled to the comparator output and the capacitor;
      an amplifier having first and second amplifier inputs and an amplifier output, in which the second amplifier input is coupled to the second comparator input; and
      a variable resistor having a control input coupled to the amplifier output.

2. The circuit of claim 1, further comprising a voltage-to-current converter having a converter input and a converter output, in which the converter input is coupled to an input voltage terminal and the converter output is coupled to the first comparator input.

3. The circuit of claim 2, wherein:
   the discharge switch has a switch control input, and
   the circuit further comprises capacitor discharge logic having a logic input and a logic output, in which the logic input is coupled to the comparator output, and the logic output is coupled to the switch control input.

4. The circuit of claim 3, wherein the logic input includes first and second logic inputs, in which the first logic input is coupled to the comparator output, and the circuit further comprises:
control loop circuitry having a loop output, in which the second logic input is coupled to the loop output.

5. The circuit of claim 4, wherein:
the control loop circuitry is configured to provide a trigger signal at the loop output,
the comparator is configured to provide a comparator output signal at the comparator output responsive to a voltage at the first capacitor terminal and a reference voltage at the second comparator input, and
the capacitor discharge logic is configured to control the discharge switch responsive to the trigger signal and the comparator output signal.

6. The circuit of claim 5, wherein:
the sample-hold circuit is configured to sample a voltage across the capacitor responsive to the comparator output signal and provide a voltage signal representative of the sampled voltage,
the amplifier is configured to provide an amplifier output signal at the amplifier output responsive to the voltage signal and the reference voltage, and
the variable resistor is configured to have a resistance responsive to the amplifier output signal to adjust the voltage at the first capacitor terminal to compensate for a turn-on delay of the comparator output signal.

7. The circuit of claim 4, further comprising:
modulation logic having first and second modulation inputs and a modulation output, in which the first modulation input is coupled to the comparator output and the second modulation input is coupled to the loop output;
a drive circuit having a drive input and first and second drive outputs, in which the drive input is coupled to the modulation output;
a first transistor having a first transistor control input and coupled between the input voltage terminal and a circuit output, in which the first transistor control input is coupled to the first drive output; and
a second transistor having a second transistor control input and coupled between the circuit output and the ground terminal, in which the second transistor control input is coupled to the second drive output.

8. The circuit of claim 7 implemented as an integrated circuit, in which the integrated circuit includes the capacitor, the comparator, the discharge switch, the sample-hold circuit, the amplifier, the variable resistor, the control loop circuitry, the capacitor discharge logic, the modulation logic, and the drive circuit.

9. The circuit of claim 1, wherein the sample-hold circuit includes:
a sample capacitor having third and fourth capacitor terminals;
a hold capacitor having fifth and sixth capacitor terminals;
a first switch coupled between the third capacitor terminal and the first capacitor terminal;
a second switch coupled between the fourth capacitor terminal and the second capacitor terminal;
third switch coupled between the fifth capacitor terminal and the third capacitor terminal; and
a fourth switch coupled between the sixth capacitor terminal and the fourth capacitor terminal.

10. The circuit of claim 9, wherein:
each of the first switch, the second switch, the third switch and the fourth switch has a respective switch control input, and
the delay correction circuit includes sample-hold control circuitry having an input and first and second clock outputs, in which the input is coupled to the comparator output, the first clock output is coupled to each of the switch control inputs of the first and second switches, and the second clock output is coupled to each of the switch control inputs of the third switch and the fourth switch.

11. The circuit of claim 1, wherein the variable resistor comprises a transistor, the amplifier is configured to provide an amplifier output signal at the amplifier output to control the transistor in a linear mode responsive to a voltage signal at the comparator output and a reference voltage at the second comparator input.

12. A circuit, comprising:
a capacitor configured to provide a capacitor voltage responsive to an input current;
a comparator configured to provide a comparator output signal responsive to the capacitor voltage and a reference voltage;
a discharge switch configured to discharge the capacitor voltage responsive to the comparator output signal;
a sample-hold circuit configured to sample a voltage across the capacitor responsive to the comparator output signal and provide a voltage signal representative of the sampled voltage;
an amplifier configured to provide an amplifier output signal responsive to the voltage signal and the reference voltage, and
a variable resistor configured to provide a resistance between the capacitor and a ground terminal responsive to the amplifier output signal to adjust the capacitor voltage to compensate for a turn-on delay of the comparator output signal.

13. The circuit of claim 12, further comprising a voltage-to-current converter configured to provide the input current responsive to an input voltage.

14. The circuit of claim 12, further comprising:
control loop circuitry configured to provide a trigger signal; and
capacitor discharge logic configured to control the discharge switch to discharge the capacitor responsive to the trigger signal and the comparator output signal.

15. The circuit of claim 14, further comprising:
a modulation circuit configured to provide a modulated signal responsive to the comparator output signal and the trigger signal, in which the modulated signal has an on-time responsive to the comparator output signal;
a drive circuit configured to provide first and second drive signals responsive to the modulated signal;
an output circuit configured to provide a switching output voltage responsive to the first and second drive signals.

16. The circuit of claim 15 implemented as an integrated circuit, in which the integrated circuit includes the capacitor, the comparator, the discharge switch, the sample-hold circuit, the amplifier, the variable resistor, the control loop circuitry, the capacitor discharge logic, the modulation circuit, and the drive circuit.

17. The circuit of claim 12, further comprising sample-hold control circuitry configured to control sampling and holding of the voltage across the capacitor in a non-overlapping manner.

18. The circuit of claim 12, wherein the variable resistor comprises a transistor, the amplifier is configured to provide the amplifier output signal to control the transistor in a linear mode.

19. An integrated circuit, comprising:
control loop circuitry having a loop output;
an on-time generator circuit having a trigger input coupled to the loop output, the on-time generator circuit comprising:
a voltage-to-current converter having a converter input and a converter output, in which the converter input is coupled to an input voltage terminal;
a comparator having first and second comparator inputs and a comparator output, in which the first comparator input is coupled to the converter output and the second comparator input is configured to receive a reference voltage;
a discharge switch coupled between the first comparator input and a ground terminal;
a capacitor having first and second capacitor terminals, the first capacitor terminal coupled to the first comparator input; and
a delay correction circuit comprising:
a sample-hold circuit coupled to the comparator output and the capacitor;
an amplifier having first and second amplifier inputs and an amplifier output, in which the second amplifier input is coupled to the second comparator input; and
a variable resistor having a control input coupled to the amplifier output;
modulation logic having first and second modulation inputs and a modulation output, in which the first modulation input is coupled to the comparator output and the second modulation input is coupled to the loop output; and
a drive circuit having a drive input and first and second drive outputs, in which the drive input is coupled to the modulation output.

20. The integrated circuit of claim 19, further comprising:
capacitor discharge logic having first and second logic inputs and a logic output, in which the first logic input is coupled to the comparator output, and the logic output is coupled to a switch control input of the discharge switch, wherein:
the control loop circuitry is configured to provide a trigger signal at the loop output,
the comparator is configured to provide a comparator output signal at the comparator output responsive to a voltage at the first capacitor terminal and the reference voltage,
the capacitor discharge logic is configured to control the discharge switch responsive to the trigger signal and the comparator output signal;
the sample-hold circuit is configured to sample a voltage across the capacitor responsive to the comparator output signal and provide a voltage signal representative of the sampled voltage,
the amplifier is configured to provide an amplifier output signal at the amplifier output responsive to the voltage signal and the reference voltage, and
the variable resistor is configured to have a resistance responsive to the amplifier output signal to adjust the voltage at the first capacitor terminal to compensate for a turn-on delay of the comparator output signal.

21. The integrated circuit of claim 19, wherein the variable resistor comprises a transistor, the amplifier is configured to provide an amplifier output signal at the amplifier output to control the transistor in a linear mode responsive to a voltage signal and the reference voltage at the second comparator input.

* * * * *